(12) United States Patent
Mizuno (10) Patent No.: US 9,831,332 B2
(45) Date of Patent: Nov. 28, 2017

(54) HIGH ELECTRON MOBILITY TRANSISTOR (HEMT) AND A METHOD OF FORMING THE SAME

(71) Applicant: SUMITOMO ELECTRIC DEVICE INNOVATIONS, INC., Yokohama-shi, Kanagawa (JP)

(72) Inventor: Shinya Mizuno, Yokohama (JP)

(73) Assignee: SUMITOMO ELECTRIC DEVICE INNOVATIONS, INC., Yokohama-Shi, Kanagawa (JP)

(\*) Notice: Subject to any disclaimer, the term of this patent is extended or adjusted under 35 U.S.C. 154(b) by 0 days.

(21) Appl. No.: 15/188,176

(22) Filed: Jun. 21, 2016

(65) Prior Publication Data

US 2016/0372588 A1     Dec. 22, 2016

(30) Foreign Application Priority Data

Jun. 22, 2015     (JP) ................. 2015-124675

(51) Int. Cl.
| | |
|---|---|
| *H01L 29/66* | (2006.01) |
| *H01L 29/778* | (2006.01) |
| H01L 29/20 | (2006.01) |
| H01L 29/423 | (2006.01) |
| H01L 29/43 | (2006.01) |

(52) U.S. Cl.
CPC .... *H01L 29/7787* (2013.01); *H01L 29/66462* (2013.01); *H01L 29/2003* (2013.01); *H01L 29/42316* (2013.01); *H01L 29/432* (2013.01)

(58) Field of Classification Search
CPC .............. H01L 21/02; H01L 21/02458; H01L 21/0254; H01L 29/20; H01L 29/20; H01L 29/2003; H01L 29/42; H01L 29/423; H01L 29/4231; H01L 29/42316; H01L 29/43; H01L 29/432; H01L 29/66; H01L 29/664; H01L 29/6646; H01L 29/66462; H01L 29/77; H01L 29/778; H01L 29/7787

USPC .......................................................... 257/76
See application file for complete search history.

(56) References Cited

U.S. PATENT DOCUMENTS

| | | | |
|---|---|---|---|
| 9,166,033 B2* | 10/2015 | Saxler | ................... H01L 21/318 |
| 2010/0155740 A1* | 6/2010 | Chinone | ............. H01L 21/0242 257/76 |
| 2016/0141404 A1* | 5/2016 | Tsai | .................... H01L 29/7787 257/76 |

FOREIGN PATENT DOCUMENTS

JP     2005-086102     3/2005

\* cited by examiner

*Primary Examiner* — Monica D Harrison
(74) *Attorney, Agent, or Firm* — Smith, Gambrell & Russell, LLP (57) ABSTRACT

A high electron mobility transistor (HEMT) made of nitride semiconductor materials, and a method to form the HEMT are disclosed. The HEMT includes a channel layer made of GaN, a barrier layer made of one of AlGaN, InAlN, and InAlGaN on the GaN channel layer, a cap layer made of n-type GaN on the barrier layer, and an insulating layer on the cap layer. The insulating layer has an opening into which the gate is formed. The cap layer has a region in the opening that has a thickness smaller than a thickness of portions of the cap layer that are outside of such region. The outside portions have a thickness that is preferably 5 nm at most.

17 Claims, 6 Drawing Sheets

HIGH ELECTRON MOBILITY TRANSISTOR (HEMT) AND A METHOD OF FORMING THE SAME

BACKGROUND OF THE INVENTION

1. Field of the Invention

The present invention relates to a semiconductor device, in particular,

2. Background Arts

A high electron mobility transistor (HEMT) including nitride semiconductor materials, in particular gallium nitride (GaN), has become popular as a semiconductor device having a high breakdown voltage and showing high output power. For instance, a Japanese Patent Application laid open No. 2005-086102A has disclosed a HEMT providing a buffer layer, a lower barrier layer, a channel layer, an upper barrier layer, and a cap layer sequentially stacked on an insulating substrate in this order.

The cap layer in a thickness thereof may control or adjust a threshold voltage of a HEMT. However, the cap layer in a thickness thereof also affects long-term stability of performance of the HEMT. That is, the threshold voltage of a HEMT often shows a positive shift as an operating time thereof increases, which decreases a drain current when the HEMT is constantly biased.

SUMMARY OF THE INVENTION

One aspect of the present invention relates to an arrangement of a high electron mobility transistor (HEMT) that includes a channel layer, a barrier layer, a cap layer, and an insulating layer. The channel layer may be made of gallium nitride (GaN). The barrier layer may be made of at least one of aluminum gallium nitride (AlGaN), indium aluminum nitride (InAlN), and indium aluminum gallium nitride (InAlGaN). The cap layer may be made of gallium nitride (GaN). The insulating layer may provide an opening into which a gate is formed. A feature of the HEMT of the present invention is that the cap layer provides a rest region in the opening of the insulating layer, and the reset region has a thickness smaller than that of the cap layer in portions outside of the rest region whose thickness is 5 nm at most.

Another aspect of the present invention relates to a method of forming a high electron mobility transistor (HEMT). The method includes steps of: (a) growing a semiconductor stack on a substrate; where the semiconductor stack includes a channel layer made of gallium nitride (GaN), a barrier layer made of at least one of aluminum gallium nitride (AlGaN), indium aluminum nitride (InAlN), and indium aluminum gallium nitride (InAlGaN), and a cap layer made of gallium nitride (GaN) by a thickness of 5 nm at most; (b) forming an insulating layer on the cap layer; (c) forming an opening in the insulating layer; (d) slightly etching the cap layer exposed within the opening so as to leave a rest region in the cap layer; and (e) forming a gate on the rest region.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Next, an embodiment of the present invention will be described as referring to drawings. In the description of the drawings, numerals or symbols same with or similar to each other will refer to element same with or similar to each other without duplicating explanations.

First Embodiment

Figure 1:
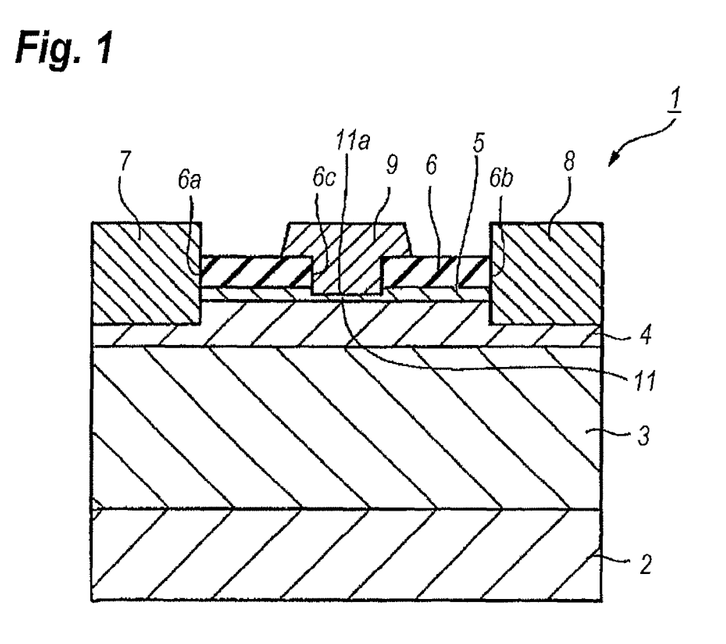
FIG. 1 schematically shows a cross section of a high electron mobility transistor (HEMT) according to an embodiment of the present invention.

FIG. 1 shows a cross section of a semiconductor device according to the first embodiment of the present invention. A transistor 1 which is one type of the semiconductor device of the first embodiment includes a substrate 2, a channel layer 3, a barrier layer 4, a cap layer 5, an insulating layer 6, and electrodes of a source 7, a drain 8, and a gate 9. The transistor 1 has a type of a high electron mobility transistor (HEMT) that provides two-dimensional electron gas (2DEG), which becomes a channel for the HEMT, in the channel layer 3 at an interface against the barrier layer 4.

The substrate 2, which is provided for an epitaxial growth of the semiconductor layers, 3 to 5, may be made of silicon (Si), silicon carbide (SiC), sapphire ($Al_2O_3$), and/or diamond (C). The present embodiment of the transistor 1 shown in FIG. 1 provides the substrate 2 made of SiC. The channel layer 3, which is an epitaxial layer grown on the substrate 2 and provides the channel, may be made of nitride semiconductor material, typically, gallium nitride (GaN). The GaN channel layer 3 may unintentionally contain dopants of an n-type and/or a p-type. The channel layer 3 has a thickness of 200 to 2000 nm.

The barrier layer 4, which is also an epitaxial layer grown on the channel layer 3, may be made of semiconductor material having electron affinity greater than that of the channel layer 3. The barrier layer 4 may be made of aluminum gallium nitride (AlGaN), indium aluminum nitride (InAlN), indium aluminum gallium nitride (InAlGaN), and so on. When the barrier layer 4 is made of one of AlGaN, InAlN, and InAlGaN; the barrier layer 4 may contain dopants of the n-type and/or the p-type. The barrier layer 4 of the embodiment is made of n-type AlGaN with a thickness of 5 to 30 nm.

The cap layer 5, which is also an epitaxial layer grown on the barrier layer 4, may be made of nitride semiconductor material, for instance, gallium nitride (GaN). The cap layer 5 of the present embodiment is made of GaN with a thickness of at least 1 nm but thinner than 5 nm, preferably thinner than 3 nm. Without the cap layer 5, the barrier layer 4 made of AlGaN or else shows an instable surface thereof.

The insulating layer 6, which covers the cap layer 5, may be made of silicon nitride (SiN) with a thickness of about 100 nm. The insulating layer 6 provides openings, 6a to 6c, where two of the openings, 6a and 6b, expose the barrier layer 4 in respective bottoms, but the rest opening 6c exposes the cap layer 5. The cap layer 5 in a region corresponding to the opening 6c is partially removed so as to leave a rest region 11 in the cap layer 5 with a thickness of 0.5 to 2.0 nm, preferably, 0.5 to 1.5 nm. A difference of the thickness of the rest region 11 and that of the cap layer 5 outside of the rest region 11 is preferably 1 to 3 nm.

The source and drain, 7 and 8, respectively, are direct in contact to the barrier layer 4. That is, portions of the cap layer 5 corresponding to the openings, 6a and 6b, are fully removed. The source and drain, 7 and 8, which are, what is called, the ohmic electrode showing no rectifying characteristic against the barrier layer 4, may be made of stacked metal including titanium (Ti) and aluminum (Al), where the titanium is in contact to the barrier layer 4. The source and drain, 7 and 8, may further stack titanium (Ti) on the aluminum (Al), that is, the source and drain, 7 and 8, may have a stacked structure of Ti/Al/Ti.

The gate 9, which is in direct contact to the cap layer 5 in the opening 6c and lies on the insulating layer 6 around the opening 6c. Specifically, the gate 9 may have a cross section of a T-shape with a bottom of the vertical bar of the T-shape, the bottom being in direct contact to a surface 11a of the rest region 11 of the cap layer 5 in the opening 6c; while, a horizontal bar of the T-shape lies on the insulating layer 6. The gate 9 may be in contact to a portion of the top surface 11a of the rest region 11, namely, a portion of the surface 11a may be exposed within the opening 6c, or in contact to a whole top surface 11a of the rest region 11. The gate 9, which is positioned between the source and drain, 7 and 8, may have a stacked metal of nickel (Ni), palladium (Pa), and gold (Au), where the nickel (Ni) forms a Schottky contact against the cap layer 5. Platinum (Pt) instead of Ni may show the Schottky contact against the cap layer 5.

Next, a process of forming the transistor 1 will be described as referring to FIGS. 2A to 4B, where these figures show respective steps of the process.

Figure 2A:
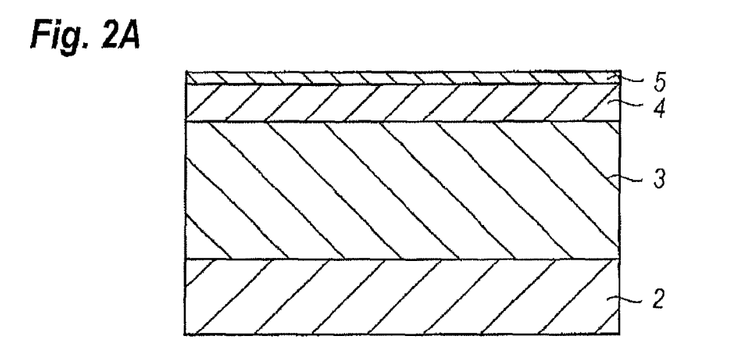
FIGS. 2A to 2C show processes of forming the HEMT shown in FIG. 1.

As the first step shown in FIG. 2A, the epitaxial growth of a GaN layer, an AlGaN layer, and another GaN layer is sequentially carried out on the SiC substrate served as the substrate 2 by, for instance, metal organic vapor phase epitaxy (MOVPE) technique. The former GaN layer is for the channel layer 3, the AlGaN layer is for the barrier layer 4, and the latter GaN layer is for the cap layer 5. The latter GaN layer may have a thickness of 5 nm at most.

Figure 2B:
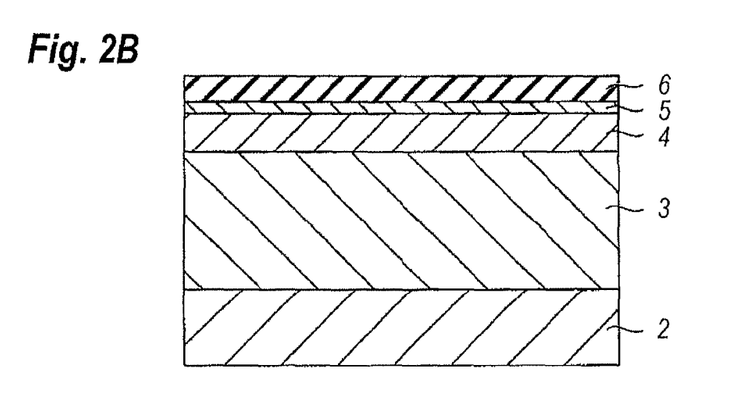

Next, as the second step shown in FIG. 2B, the process deposits an insulating layer 6 on thus grown cap layer 5. For instance, a plasma enhanced chemical vapor deposition (p-CVD) technique may form the insulating layer 6 on the cap layer 5 by using silane ($SiH_4$) and ammonia ($NH_3$) as source materials of the insulating layer 6 made of silicon nitride (SiN).

Figure 2C:
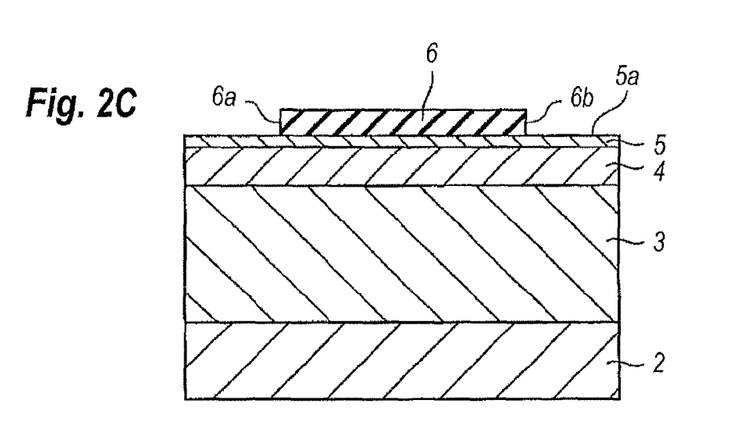

Then, as the third step shown in FIG. 2C, the process partially etches the insulating layer 6 so as to form the openings, 6a and 6b. Specifically, patterning a photoresist so as to provide openings corresponding to the openings, 6a and 6b, and subsequent dry-etching the insulating layer 6, the openings, 6a and 6b, the surface 5a of the cap layer 5 may be exposed within the openings, 6a and 6b, in the insulating layer 6.

Figure 3A:
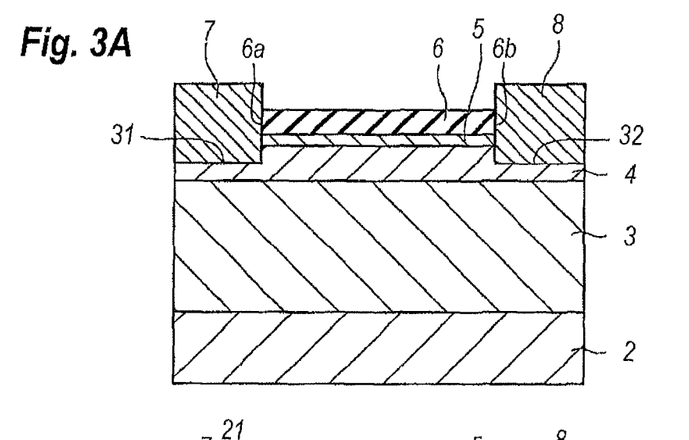
FIGS. 3A to 3C show processes of forming the HEMT subsequent to the process shown in FIG. 2C.

Then, as the fourth step shown in FIG. 3A, removing portions of the cap layer 5 within the openings, 6a and 6b, so as to expose a surface of the barrier layer 4, and further removing portions of the barrier layer 4 thus exposed to form recesses, 31 and 32, therein, and filling thus formed recesses, 31 and 32, by metals for the electrodes; the source and the drain, 7 and 8, may be formed on the barrier layer 4.

Figure 3B:
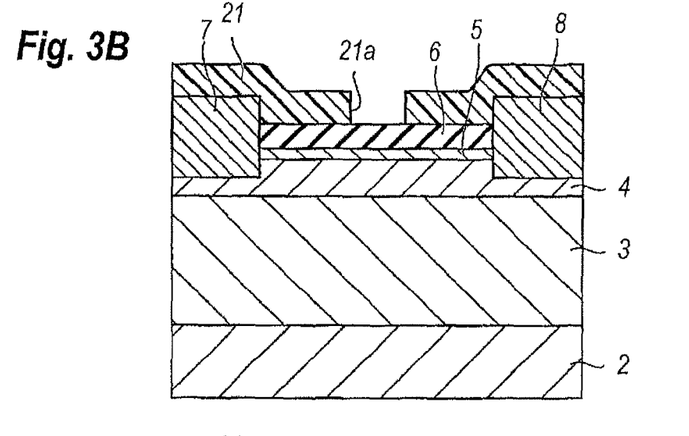
Figure 3C:
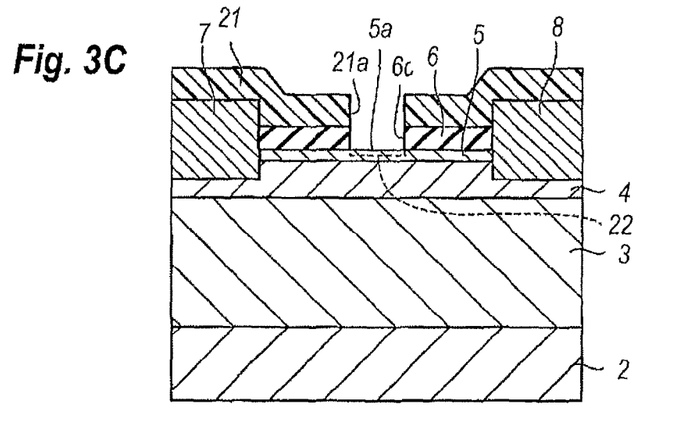

Next, as the fifth step shown in FIG. 3B, the process forms a patterned photoresist that covers the electrodes of the source and the drain, 7 and 8, but exposes the surface of the insulating layer 6 within an opening 21a. The patterning of the photoresist may be processed by the electron beam lithography. Subsequently, as the sixth step shown in FIG. 3C, the insulating layer 6 is selectively etched in a portion exposed within the opening 21a so as to form an opening 6c therein. Dry-etching or plasma etching, for instance, the reactive ion etching by the induction coupled plasma (ICP-RIE) using sulfur hexafluoride ($SF_6$) as a reaction gas may etch the insulating layer 6 type of silicon compound. One example of the etching condition is plasma power of 100 to 500 W, bias power of 10 to 30 W, and a pressure of around 1 Pa. The dry-etching thus described may exposes a portion of the surface 5a of the cap layer 5 as shown in FIG. 3C.

Figure 4A:
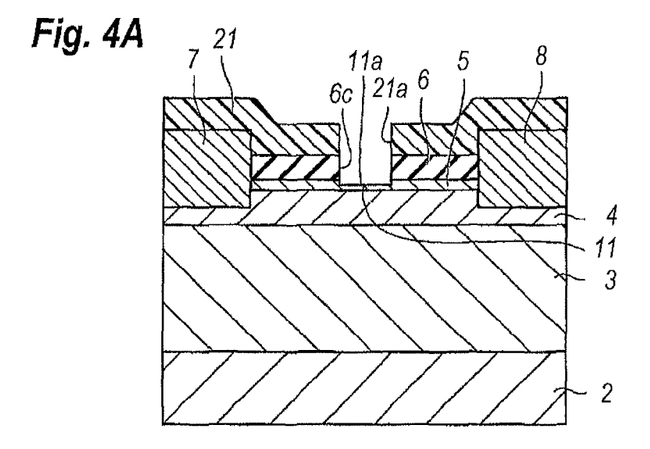
FIGS. 4A and 4B show processes of forming the HEMT subsequent to the process shown in FIG. 3C.

Then, as the seventh step shown in FIG. 4A, the process slightly etches the surface 5a of the cap layer 5 thus exposed by using chloride plasma generated by ionizing a chloride gas including at least one of chlorine ($Cl_2$) and silicon tetrachloride ($SiCl_4$). This chloride plasma processing, which is carried out by the ICP-RIE, may remove or slightly etch a surface region 22 of the cap layer 5 so as to leave a rest region 11 in the cap layer 5. A thickness of the rest region 11 may be determined by an etching rate of the cap layer 5 and a time of the chloride plasma processing. One example of the chloride plasma processing is: a flow rate of the silicon tetrachloride ($SiCl_4$) is 2 to 100 sccm, that of the chlorine ($Cl_2$) is 5 to 200 sccm, that is, a mixture of chlorine and silicon tetra-chloride is used as a reaction gas, a pressure of 0.2 to 4 Pa, RF power of 20 to 300 W, and bias power of 3 to 100 W. Because of the slight etching of the cap layer 5, the time of the chloride plasma process is typically five (5) seconds at most.

Figure 4B:
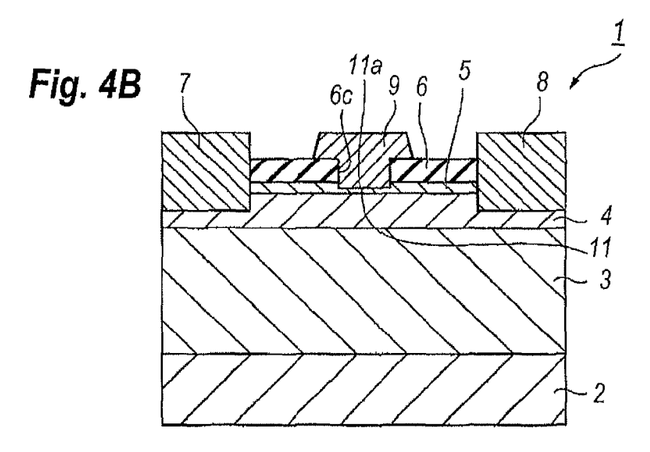

Next, as the eighth step as shown in FIG. 4B, the process, after removing the photoresist, forms the gate 9 by a physical vapor deposition (PVD) technique, typically, the evaporation and/or the sputtering. The gate 9 is formed so as to cover a whole of surface 11a of the rest region 11 exposed by the chloride plasma processing performed on the cap layer 5. Accordingly, the gate 9 has a portion in contact with the surface 11a of the rest region 11, which forms a Schottky contact against the cap layer 5, and another portion on the insulating layer 6. Thus, the transistor 1 of HEMT type may be formed.

Next, electrical characteristics of the transistor 1 of the present embodiment will be compared with electrical characteristics of a transistor comparable to the present transistor. Specifically, degradation, or a decrement, in the drain current under fixed bias conditions depending on an operating time will be compared in two transistors as referring to FIGS. 5 and 6. The transistor comparable to that of the present embodiment leaves the surface region 22 of the cap layer 5; that is, the transistor of the comparable example does not distinguish the rest region 11 from the surface region 22. Other arrangements and process conditions are same in two transistors.

Figure 5:
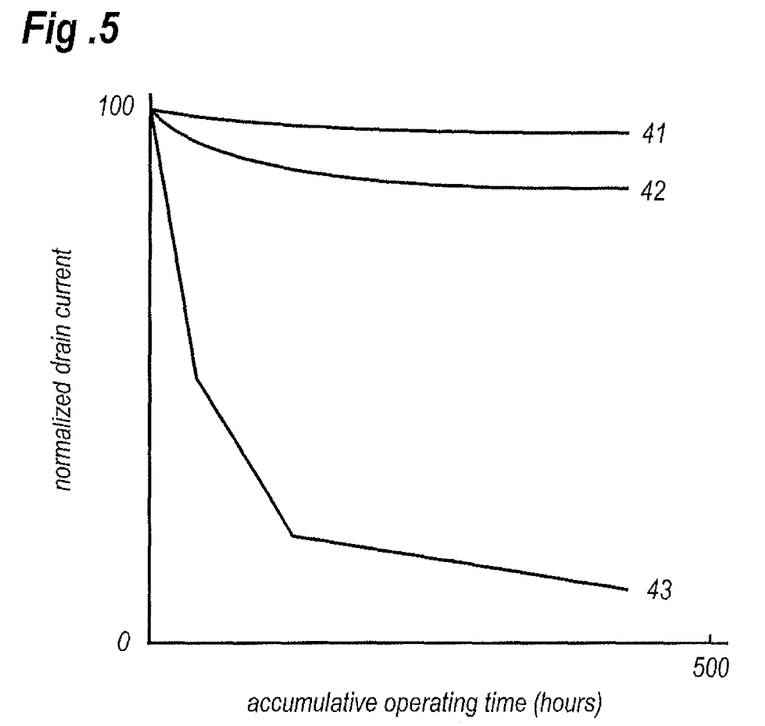
FIG. 5 shows long-term degradation in a drain current of a HEMTs according to an example comparable to the HEMT of the present embodiment, where the HEMT corresponding to FIG. 5 does not experience the chloride plasma process.
Figure 6:
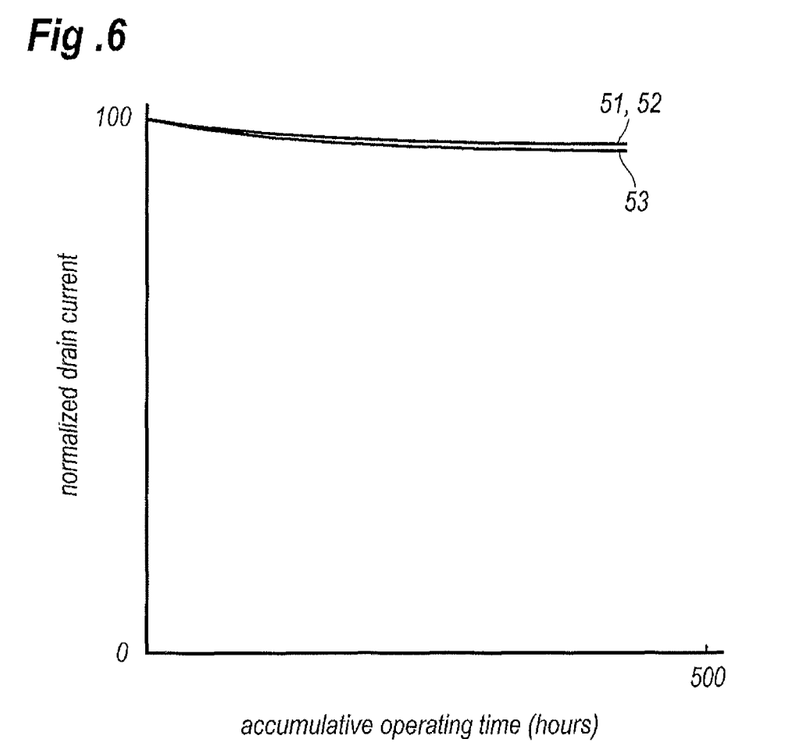
FIG. 6 shows long-term degradation in the drain current of the HEMTs of the present embodiment that experiences the chloride plasma processing.

FIG. 5 shows the decrement of the drain current of the transistor comparable to the present embodiment as the operating time thereof increases; while, FIG. 6 shows those for the transistor 1 of the present embodiment, where the drain currents were measured under fixed bias conditions in the drain and the gate. In FIGS. 5 and 6, the drain currents were normalized by those at the beginning of the operation. Also, in FIGS. 5 and 6, behaviors, 41 and 51, corresponded to the transistors having the cap layer 5 of thicknesses of 10 nm, behaviors, 42 and 52, corresponded to the transistors with the cap layer 5 of thicknesses of 5 nm, and behaviors, 43 and 53, corresponded to cases where the thicknesses of the cap layer 5 were 3 mm For the transistor 1 of the present embodiment, the rest region 11 in the cap layer 5 left the thickness of about 2 nm. That is, the thicknesses of 10 nm, 5 nm, and 3 nm of the behaviors, 51 to 53, corresponded to the original thicknesses of the cap layer 5 not processed by the chloride plasma. Accordingly, differences between the thickness of the rest region 11 and the original thickness of the cap layer 5 were 8, 3, and 1 nm, respectively. For instance, when the cap layer 5 has an original thickness of 5, 3, and 1.5 nm; while, the rest region 11 has a thickness of 2, 2, and 0.5 nm, then the step formed at the edges of the rest region 11 has a height of 3, 1, and 1 nm, respectively.

Referring to FIG. 5, the decrement of the drain current for the comparable transistor is enhanced as the cap layer 5 becomes thinner. The cap layer 5 with a thickness of 3 nm shows a drastic decrement of the drain current compared with the case of the thickness of 5 nm. Moreover, for a comparable transistor having the cap layer with a thickness of 10 nm shows substantially no decrease in the drain current as the accumulative operating time increases. The decrease of the drain current may be due to a positive shift of a threshold voltage of the transistor as the accumulative operating time increases.

As to the transistor 1 of the present embodiment, as shown in the behaviors, 51 to 53, in FIG. 6, even the cap layer 5 has an original thickness less than 5 nm, which corresponds to the behaviors, 52 and 53, the drain current shows no substantial decrement. The cap layer 5 with a thickness of 10 nm also shows no decrement in the drain current, which is same with the case of the comparative transistor shown by the behavior 43 in FIG. 5.

Next, the existing of the rest region 11, in particular, a function of the rest region and a process of forming the rest region 11, will be considered. It is well known in a transistor that a recess formed in a portion where the gate electrode is to be provided may adjust the threshold voltage of the transistor by a depth thereof. That is, the gate recess may shorten a distance between the gate electrode and a channel in which electrons flow, which not only controls the threshold voltage but enhances the trans-conductance (gm) of the transistor. The rest region 11 of the cap layer 5 of the present embodiment has a thickness of only around 5 nm, or thinner; specifically, the rest region 11 is formed in the cap layer 5 whose original thickness is set around 5 nm or thinner, which automatically sets a difference or a step between the rest region 11 and portions outside of the rest region 11 to be around 5 nm or less. Accordingly, such a thinner rest region 11, or the small step, may not substantially adjust the threshold voltage of the transistor 1.

Also, comparing FIG. 6 with FIG. 5, when the cap layer 5 has a thickness of 10 nm, the function of the rest region 11, namely, the reduction of the long-term degradation in the drain current, becomes hard to be distinguished. Accordingly, a HEMT having a relatively thicker cap layer 5 may resolve the subject of the present embodiment. However, a thicker cap layer inevitably causes the degradation of Idmax (saturated drain current) and power density. Accordingly, the cap layer 5 is preferably thin as possible to avoid the degradation of Idmax.

The static long-term degradation in the drain current may be undistinguishable between two transistors, one is formed by the processes without the chloride plasma process and the other experiences the chloride plasma processing. This means that the chloride plasma processing on the surface of the cap layer 5 shows substantially no contribution for cleaning the surface 11a of the rest region 11. Therefore, it should be necessary to seek reasons for suppressing the long-term degradation in the drain current except for the gate recessing and/or the chloride plasma cleaning of the semiconductor surface. One possible but speculative reason that may explain the phenomenon above described is to improve the interface between the cap layer 5 and the barrier layer 4 by the chloride plasma or to reduce a mass of the cap layer 5 under the gate.

As described above, a nitride semiconductor device, in particular, a HEMT having an arrangement of the channel layer, the barrier layer and the cap layer made of gallium nitride (GaN), aluminum gallium nitride (AlGaN) and gallium nitride (GaN), respectively, shows a drain current collapsing where the drain current does not recover after an extreme drain positive bias concurrently with an extreme gate negative bias. Deep traps inherently induced within the cap layer are seemed to be one reason of the current collapsing. That is, the deep traps in the cap layer capture electrons in the channel and are negatively charged, which partially compensates the gate bias for flowing carries within the channel. The deep traps releasing the captured electrons depending on the life time thereof; accordingly, the current collapsing may recover as showing the time constant thereof substantially equal to the life time of the deep traps. Although the current collapsing in the drain current may be a dynamic phenomenon of a transistor made of nitride semiconductor materials, the long-term degradation of the drain current subject to the present embodiment is seemed to relate to the current collapsing. Therefore, the cap layer 5 in the HEMT made of nitride semiconductor materials is inevitable but a thickness thereof is preferably thinner than 5 nm, or a step against portions not processed with the chloride plasma is preferably 1 to 3 nm.

The HEMT according to the present embodiment provides the gate 9 on the surface 11a of the rest region 11 of the cap layer 5, where the rest region 11 is exposed to the chloride plasma. Such a HEMT may effectively suppress the positive shift of the threshold voltage of the HEMT and reduce the long-term degradation of the drain current.

The rest region 11 of the cap layer 5 may have a thickness less than 3 nm. When the step against the portions except for the rest region 11 is less than 3 nm, the reduction of the long-term degradation in the drain current may be further enhanced. The rest region 11 may have a thickness of 0.5 to 2.0 nm. The step between the rest region 11 and those except for the rest region 11 may be 1 to 3 nm.

The gate 9 may be in contact with and cover the whole of surface 11a of the rest region 11, or may leave surface 11a partially covered. The process according to the present embodiment may form the opening 6c in the insulating layer 6 by selectively etching the insulating layer 6 by a reactive gas containing fluorine (F). The selective etching of the insulating layer 6 may be carried out using a patterned photoresist. Next, the photoresist may be removed. The gate may be formed by another photoresist patterning over the opening 6c.

In the foregoing detailed description, the method and apparatus according to the present invention have been described with reference to specific exemplary embodiments thereof. However, it would be evident that various modifications and changes may be made thereto without departing from the broader spirit and scope of the present invention. For instance, the HEMT may further provide a buffer layer between the substrate 2 and the channel layer 3, where the buffer layer may be epitaxially grown on the substrate 2 and include a layer made of aluminum nitride (AlN). Also, the process thus described forms the gate 9 by the photoresist to form the opening 6c in the insulating layer 6. However, the process may carry out the deposition of the gate 9 by another patterned photoresist. Thus, The present specification and drawings are accordingly to be regarded as illustrative rather than restrictive.

I claim:

1. A high electron mobility transistor (HEMT), comprising:
   a channel layer made of gallium nitride (GaN);
   a barrier layer provided on the Channel layer, the barrier layer being made of one of aluminum gallium nitride (AlGaN), indium aluminum nitride (InAlN), and indium aluminum gallium nitride (InAlGaN);
   a cap layer provided on the barrier layer, the cap layer being made of gallium nitride (GaN), and having a portion that is a rest region and outside portions outside of the rest region;
   an insulating layer provided on the cap layer, the insulating layer having an opening; and
   a gate provided within the opening of the insulating layer and being in direct contact with the cap layer,
   wherein the rest region is within the opening in the insulating layer and has a thickness smaller than a thickness of the outside portions of the cap layer, and
   wherein the outside portions of the cap layer have a thickness of 5 nm at most, and the rest region has a thickness of 0.5 to 2.0 nm.

2. The HEMT of claim 1, wherein the thickness of the outside portions is 3 nm at most.

3. The HEMT of claim 1, wherein the cap layer has a step of 1 to 3 nm between the rest region and the outside portions.

4. The HEMT of claim 1,
   wherein the gate is in direct contact with a surface of the rest region of the cap layer, and
   wherein the gate covers a whole of the surface of the rest region.

5. The HEMT of claim 1,
   wherein the gate is in direct contact with a surface of the rest region of the cap layer, and
   wherein the gate partially covers the surface of the rest region.

6. The HEMT of claim 5, wherein the surface of the rest region is partially exposed within the opening of the insulating layer.

7. A method of forming a high electron mobility transistor, said method comprising steps of:
   growing a channel layer, a barrier layer, and a cap layer sequentially on a substrate, the channel layer being made of gallium nitride (GaN), the barrier layer being made of one of aluminum gallium nitride (AlGaN), indium aluminum nitride (InAlN), and indium aluminum gallium nitride (InAlGaN), and the cap layer being made of gallium nitride (GaN), the cap layer having a thickness of 5 nm at most;
   forming an insulating layer on the cap layer;
   forming an opening in the insulating layer;
   etching a portion of the cap layer exposed within the opening in the insulating layer by chloride plasma so as to leave the cap layer with a rest region having a thickness of 0.5 to 2.0 nm; and
   forming a gate on the rest region of the cap layer.

8. The method of claim 7, wherein the step of etching of the portion of the cap layer forms outside portions outside of the rest region, the outside portions having a thickness of 3 nm at most.

9. The method of claim 7, wherein the step of etching the cap layer by the chloride plasma leaves a 1 to 3 nm step between the rest region and portions of the cap layer outside of the rest region of the cap layer.

10. The method of claim 7, wherein the step of forming the gate includes a step of covering a whole of a surface of the rest region of the cap layer by the gate.

11. The method of claim 7, wherein the step of forming the gate includes a step of partially covering a surface of the rest region of the cap layer by the gate.

12. The method of claim 11, wherein the step of forming the gate includes a step of partially exposing the surface of the rest region within the opening of the insulating layer.

13. A high electron mobility transistor (HEMT), comprising:
   a channel layer made of gallium nitride (GaN);
   a barrier layer provided on the channel layer, the barrier layer being made of one of aluminum gallium nitride (AlGaN), indium aluminum nitride (InAlN), and indium aluminum gallium nitride (InAlGaN);
   a cap layer provided on the barrier layer, the cap layer being made of gallium nitride (GaN), and having a portion that is a rest region and outside portions outside of the rest region;
   an insulating layer provided on the cap layer, the insulating layer having an opening in which the rest region is provided; and
   a gate extending into the opening of the insulating layer to directly contact the rest region,
   wherein the outside portions have a thickness of not more than 5 nm, and the rest region has a thickness smaller than the thickness of the outside portions.

14. The HEMT of claim 13, wherein the thickness of the outside portions is not more than 3 nm.

15. The HEMT of claim 14, wherein the thickness of the rest region is 0.5 to 2.0 nm.

16. The HEMT of claim 13, wherein the cap layer has a step of 1 to 3 nm between the rest region and the outside portions.

17. The HEMT of claim 13, wherein the gate at least partially covers a surface of the rest region.

* * * * *